United States Patent
Kim et al.

(10) Patent No.: US 10,847,681 B2
(45) Date of Patent: Nov. 24, 2020

(54) METHOD FOR MANUFACTURING MICRO LIGHT EMITTING DEVICE BY MINIMIZING MASK PROCESSES, AND MICRO LIGHT EMITTING DEVICE

(71) Applicant: KOREA UNIVERSITY RESEARCH AND BUSINESS FOUNDATION, Seoul (KR)

(72) Inventors: Tae Geun Kim, Seongnam-si (KR); Kyung Rock Son, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 16/009,477

(22) Filed: Jun. 15, 2018

(65) Prior Publication Data
US 2019/0386181 A1    Dec. 19, 2019

(51) Int. Cl.
| H01L 29/18 | (2006.01) |
| H01L 33/42 | (2010.01) |
| H01L 27/15 | (2006.01) |
| H01L 33/44 | (2010.01) |
| H01L 33/32 | (2010.01) |
| H01L 33/00 | (2010.01) |

(52) U.S. Cl.
CPC .......... *H01L 33/42* (2013.01); *H01L 27/153* (2013.01); *H01L 33/0075* (2013.01); *H01L 33/32* (2013.01); *H01L 33/44* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS 9,768,359 B2 *    9/2017   Kim

FOREIGN PATENT DOCUMENTS

| KR | 10-1211108 B1 | 12/2012 |
| KR | 10-1332686 B1 | 11/2013 |
| KR | 10-1505512 B1 | 3/2015 |

* cited by examiner

*Primary Examiner* — Hung K Vu
(74) *Attorney, Agent, or Firm* — Hauptman Ham, LLP

(57) ABSTRACT

Provided are a micro LED and a method for manufacturing the same. When the micro LED is manufactured, an n-electrode and a protective layer formed on the micro LED is made of a variable resistance material that is a transparent material, and a voltage greater than a unique threshold voltage of the variable resistance material is applied to the variable resistance material on an area of the protective layer formed on the p-type semiconductor layer to form a conductive filament in the variable resistance material, thereby forming a transparent electrode. Thus, the micro LED according to the present invention may be produced with lower cost and higher productivity by omitting the mask process for forming the transparent electrode in the prior art.

5 Claims, 3 Drawing Sheets

METHOD FOR MANUFACTURING MICRO LIGHT EMITTING DEVICE BY MINIMIZING MASK PROCESSES, AND MICRO LIGHT EMITTING DEVICE

BACKGROUND

The present invention relates to a micro light emitting device (LED) and a method for manufacturing the same, and more particularly, to a micro LED, in which a variable resistance material is used for a transparent electrode, and a method for manufacturing the same.

External quantum efficiency (EQE) of a nitride-based LED is reduced as a current density to be injected gradually increases, which is called an efficiency droop.

In recent years, to solve such a problem, studies on micro LEDs having pixels, each of which has a size less than 100 and having a current spreading effect and current injection efficiency are being actively carried out rather than general large-area LEDs.

Micro LEDs have been reported to not only solve efficiency degradation problems but also have more improved electrical and optical properties. Micro LEDs are being applied as alternative light sources in various fields, in which existing LED light sources such as illumination, display, vehicle head-lamp, and the like are used, on the basis of these advantages.

Here, micro LEDs have two driving methods, that is, a unit pixel driving method and an array driving method according to the purpose of application. In the case of the array-driven micro LED, all the pixels constituting an array are connected to each other by using one p-electrode to drive all the pixels at a time.

Generally, in such a micro LED, before a process of connecting all the pixels by using the p-electrode is performed, it is necessary to deposit a protective layer material (for example, SiOx or SiNx) for separating an n-electrode (or an n-GaN) and a p-electrode from each other so that an n-GaN or n-electrode portion and a p-electrode portion, which are exposed in a space between the pixels of the micro LED, are not connected to each other.

An overall manufacturing process of the existing array-driven micro LED will be described with reference to FIG. 1. First, an n-GaN layer, an active layer (MQW), and a p-GaN layer are formed on a substrate, and a MESA etching process is performed by using a mask to separate cells from each other (see FIG. 1(a)). Thereafter, ITO is deposited on the p-GaN layer by using a mask to form a transparent electrode layer (see FIG. 1(b)), and an n-electrode is deposited between the cells by using a mask (see FIG. 1(c)). When the n-electrode is formed, a protective layer is deposited between the cells by using a mask, thereby separating the n-electrode from the p-electrode (see FIG. 1(d)). Finally, the p-electrode is deposited on an upper portion of the transparent electrode by using a mask (see FIG. 1(e)).

As described above, five mask processes are performed in the micro LED process. Since the mask processes in the semiconductor process are complicated, time-consumed, and extremely expensive, the product cost increases as the number of mask processes increases. On the other hand, the product cost decreases as the number of mask processes decreases.

Thus, to reduce the production cost of the product and improve productivity, it is necessary to reduce the number of mask processes in the micro LED process. However, in the case of the array-driven micro LED, the five mask processes have been reported as the minimum number of processes, so far.

SUMMARY

An object of the present invention is to provide a micro LED in which the number of mask processes is minimized to reduce manufacturing costs and improve productivity and a method for manufacturing the same.

A preferred embodiment of the present invention provides a method for manufacturing a micro light emitting device (LED), the method including: a step (a) of successively forming a first semiconductor layer, an active layer, and a second semiconductor layer on a substrate; a step (b) of successively etching the second semiconductor layer, the active layer, and the first semiconductor layer by using a mask to expose the first semiconductor layer, thereby forming a plurality of micro LED cells on the substrate; a step (c) of forming first electrodes in parallel to each other in a plurality of rows between the micro LED cells by using a mask; a step (d) of depositing a variable resistance material that is a transparent material on the substrate to form a protective layer on the first electrodes and the second semiconductor layer of the plurality of micro LED cells and applying a voltage to each of protective layer regions formed above the second semiconductor layer to form a conductive filament, thereby forming a transparent electrode on the second semiconductor layer of the plurality of micro LED cells; and a step (e) of forming a second electrode on the transparent electrode of each of the micro LED cells by using a mask.

In the above aspects, in the step (d), the protective layer is formed so that a hole for exposing a portion of the second semiconductor layer to the outside is formed by using a mask, and a voltage greater than a unique threshold voltage of the variable resistance material is applied to the portion of the second semiconductor layer exposed to the outside and a portion of the protective layer on the second semiconductor layer to form the conductive filament, thereby forming the transparent electrode.

In the above aspects, in the step (e), the second electrode is deposited on the hole.

In the above aspects, in the step (d), one of a pair of probe electrodes comes into strong contact with an upper portion of the protective layer to allow the probe electrode to pass through the protective layer formed on the second semiconductor layer, the other probe electrode comes into contact with the protective layer region formed above the second semiconductor layer, and a voltage greater than a unique threshold voltage of the variable resistance material is applied to form the conductive filament, thereby forming the transparent electrode.

In the above aspects, in the step (e), the second electrode is formed at a position at which the probe electrode passes through the protective layer to expose the second semiconductor layer.

A preferred embodiment of the present invention provides a micro light emitting device (LED) including: a substrate; a plurality of micro LED cells formed on the substrate; first electrodes formed in parallel to each other in a plurality of rows between the micro LED cells; a protective layer deposited by using transparent variable resistance materials on the first electrode and the plurality of micro LED cells; a transparent electrode that is changed to have conductivity by forming a conductive filament in a region of the protective layer, which is defined in an upper portion of each of the micro LED cells; and a second electrode formed on the transparent electrode, wherein each of the micro LED cells is formed by successively forming a first semiconductor layer, an active layer, and a second semiconductor layer, in the micro LED cells, the second semiconductor layers are separated from each other, the active layers are separated from each other, and the first semiconductor layers are connected to each other, and the first electrode is formed on the first semiconductor layer, which exposed to the outside between the micro LED cells.

In the above aspects, a hole through which a probe electrode comes into contact with the second semiconductor layer is defined in the transparent electrode when the conductive filament is formed.

In the above aspects, the second electrode is formed on the transparent electrode filling in the hole to come into contact with the transparent electrode.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Preferred embodiments of the present invention will be described below in more detail with reference to the accompanying drawings.

Figure 1:
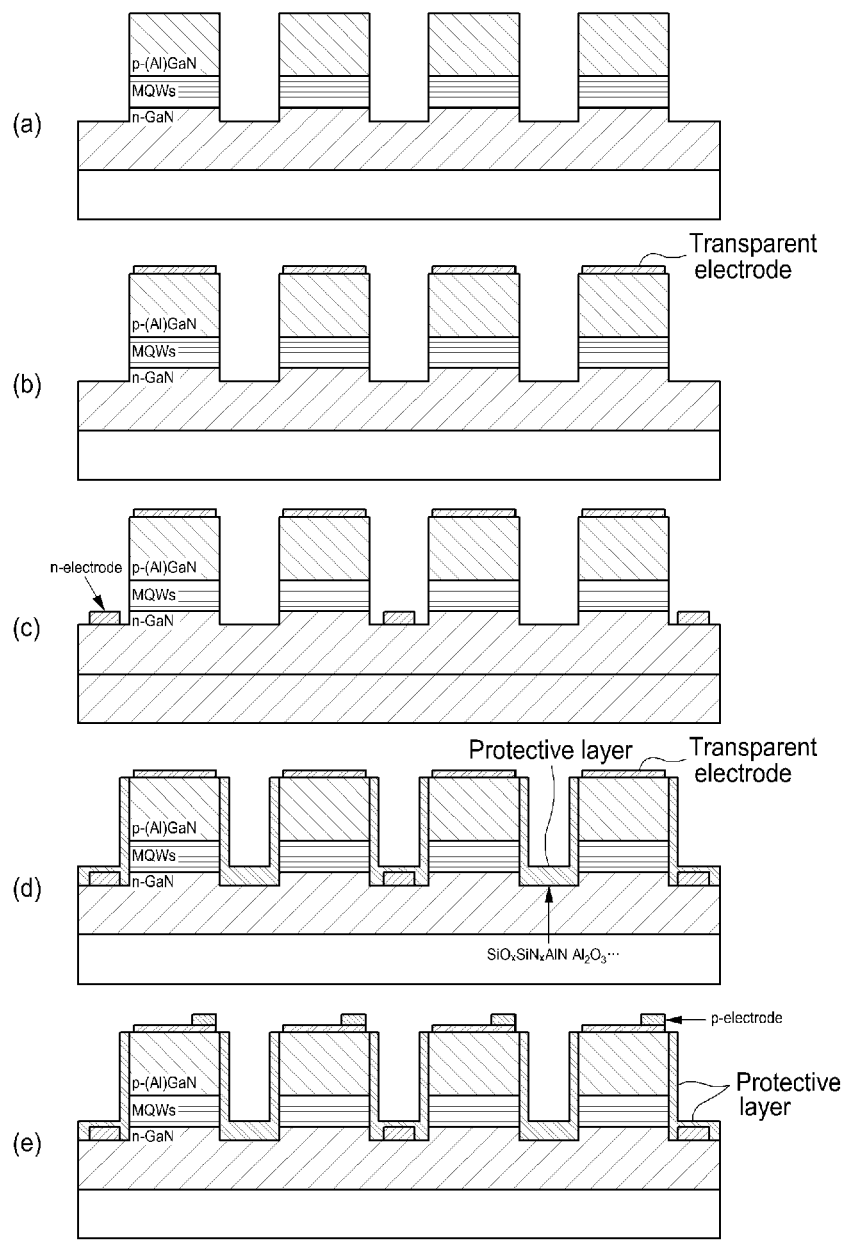
FIG. 1 is view illustrating a process of manufacturing a micro LED according to a related art.
Figure 2:
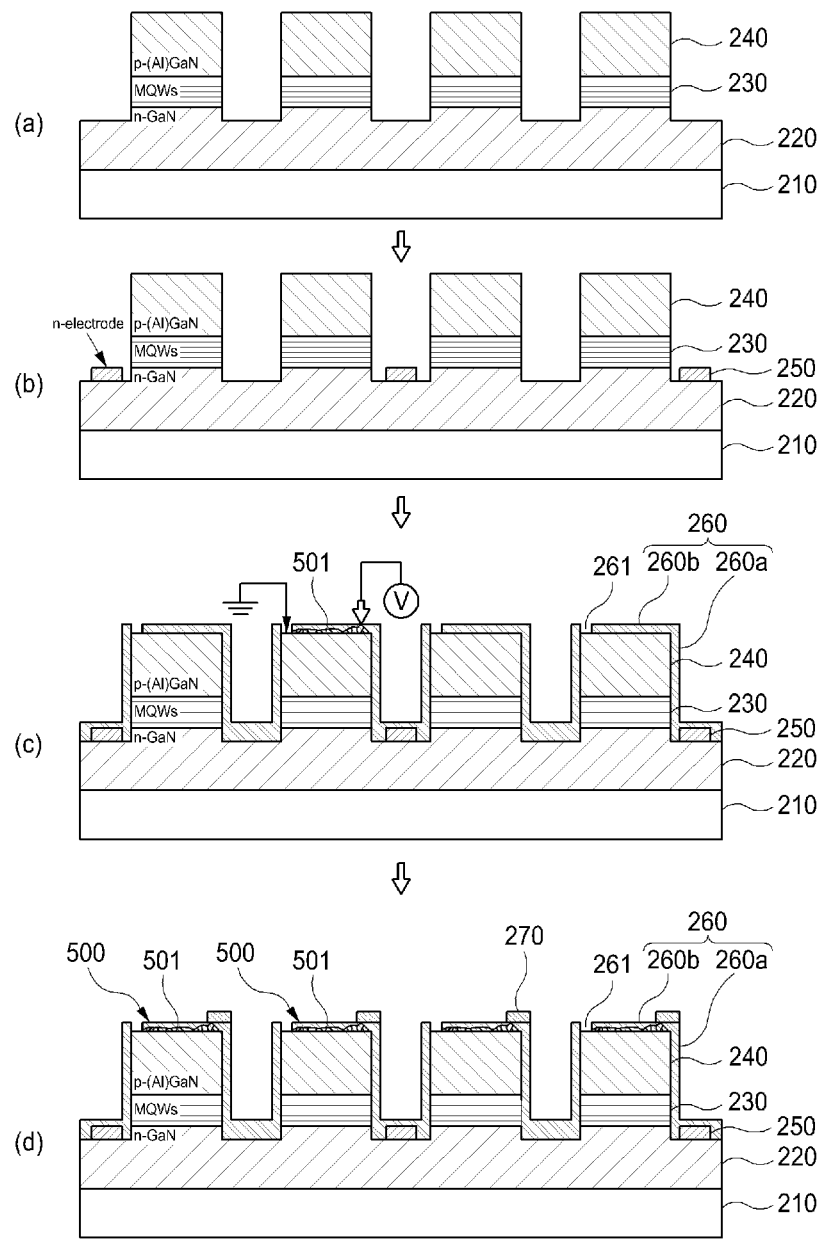
FIG. 2 is a view for explaining a process of manufacturing a micro LED and a structure of the micro LED manufactured through the manufacturing process according to a first preferred embodiment of the present invention.

FIG. 2 is a view for explaining a process of manufacturing a micro LED and a structure of the micro LED manufactured through the manufacturing process according to a first preferred embodiment of the present invention.

A process of manufacturing a micro light emitting device (LED) according to a first preferred embodiment of the present invention will be described with reference to FIG. 2. First, a first semiconductor layer 220, an active layer (a multi-quantum well (MQW)) 230, and a second semiconductor layer 240 are successively deposited on a substrate 210, and a MESA etching process is performed by using a first mask to separate a plurality of micro LED cells from each other on the substrate 210 (see FIG. 2(a)). Here, the etching is performed to expose a surface of the first semiconductor layer 220, thereby separating the plurality of micro LED cells constituting the micro LED from each other. Thus, in the micro LED cells, the first semiconductor layers 220 are connected to each other. However, the active layers (MQW) 230 are separated from each other, and also, the second semiconductor layers 240 are separated from each other. The separated micro LED cells are arranged in a line when viewed in a horizontal axis direction and a vertical axis direction.

In the preferred embodiment of the present invention, the first semiconductor layer 220 may be an n-GaN layer, and the second semiconductor layer 240 may be a p-(Al)GaN layer. However, the first semiconductor layer 220 and the second semiconductor layer 240 may be made of materials different from each other according to specification of the LED.

Thereafter, a first electrode (an n-electrode) 250 corresponding to the first semiconductor layer 220 is formed in a space between the cells on the surface of the first semiconductor layer 220, which is exposed to the outside by the etching, by using a second mask (see FIG. 2(b)). The first electrodes 250 may be formed in parallel to each other in a plurality of rows.

Then, a protective layer 260 is deposited on the entire area of the first semiconductor layer 220, the first electrode 250, and the second semiconductor layer 240 by using a variable resistance material that is a transparent material (see FIG. 2(c)). Here, a hole 261 is formed in an upper portion of the second semiconductor layer 240 by using a third mask.

Thereafter, in the first preferred embodiment of the present invention, one of a pair of probe electrodes for applying a voltage comes into contact with the second semiconductor layer 240 through the hole 261 formed in the upper portion of the second semiconductor layer 240, and the other probe electrode comes into contact with the protective layer 260 formed on the first semiconductor layer 220. Then, a voltage greater than a unique threshold voltage of the variable resistance material is applied to the variable resistance material to form a conductive filament in a region of the protective layer 260 made of the variable resistance material that is a transparent material on the second semiconductor layer 240. As a result, a transparent electrode 500 is formed on the second semiconductor layer 240.

The variable resistance material is mainly used in a resistive RAM (ReRAM) fields. When the voltage greater than a unique threshold value, electro-forming (electric breakdown) is performed by a defective structure within a thin film to form the conductive filament 501 through which current flows. Thus, the resistance state of the material that is initially an insulator changes from a high resistance state to a low resistance state to exhibit conductivity. Thereafter, the conductive filament may be maintained even though the voltage applied to the variable resistance material is removed. As a result, current flows through the conductive filament, and thus, the resistance state of the material is maintained in the low resistance state.

Although the protective layer 260 is formed by using transparent conductive oxide-based materials ($SiO_2$, $Ga_2O_3$, $Al_2O_3$, ZnO, and the like) as the variable resistance material, materials other than the oxide-based materials may be applied as long as a variable resistance material that is a transparent material has resistance switching characteristics.

Referring to FIG. 2(c), when a probe comes into contact with the second semiconductor layer 240 exposed through the hole 261 and the protective layer 260 formed on the second semiconductor layer 240 and a voltage is applied through the probe, as illustrated in FIG. 2(c), the conductive filament 501 is locally formed in the region of the protective layer 260 formed on the second semiconductor layer 240 to change into the low resistance state in which the current flows through the conductive filament 501. That is, the protective layer region 260b formed above the second semiconductor layer 240 may change into a state in which the current locally flows to perform a function as a transparent electrode 500. On the other hand, since the conductive filament 501 is not formed in the remaining protective layer region 260a in which the conductive filament 501 is not formed, the current does not flow to be maintained in the high resistance state so that an electrical insulation state is maintained between the first electrode (the n-electrode) and the transparent electrode 500 formed on the second semiconductor layer 240.

Thereafter, as illustrated in FIG. 2(d), a second electrode 270 (a p-electrode) is deposited on the transparent electrode 500 formed on the second semiconductor layer 240 by using a fourth mask to complete the micro LED. Here, a second electrode 270 may be formed at an any position on the transparent electrode 500 or formed to fill in the hole 261 formed in the transparent electrode 500 to come into contact with the transparent electrode 500.

As illustrated in FIG. 2(d), in the case of the micro LED according to the first preferred embodiment of the present invention, when the voltage is applied between the first electrode (the n-electrode) 250 and the second electrode (the p-electrode) 270, the current introduced through the second electrode 270 is injected into the second semiconductor layer through the conductive filament 501 of the transparent electrode 500 formed on the second semiconductor layer 240, and thus, the active layer 230 emits light by the current injected into the second semiconductor layer 240. The light generated at the active layer 230 is emitted to the outside through the transparent electrode 500 and the transparent protective layer 260.

Here, the first electrode 250 and the transparent electrode 500 (and the second electrode 270) formed on the second semiconductor layer 240 are insulated from each other by the protective layer region 260a in which the conductive filament 501 is not formed.

In conclusion, in the first preferred embodiment of the present invention, to maintain the insulation between the first electrode 250 and the second electrode 270, the protective layer 260 is formed on the entire surface of the micro LED using the variable resistance material and the conductive filament 501 may be formed in the region 260b of the protective layer 260 above the second semiconductor layer 240 to change the corresponding protective layer region 260b into the transparent electrode 500. Thus, the mask process for forming the transparent electrode 500 on the second semiconductor layer 240 according to the related art may be omitted to reduce the production cost of the micro LED.

Figure 3:
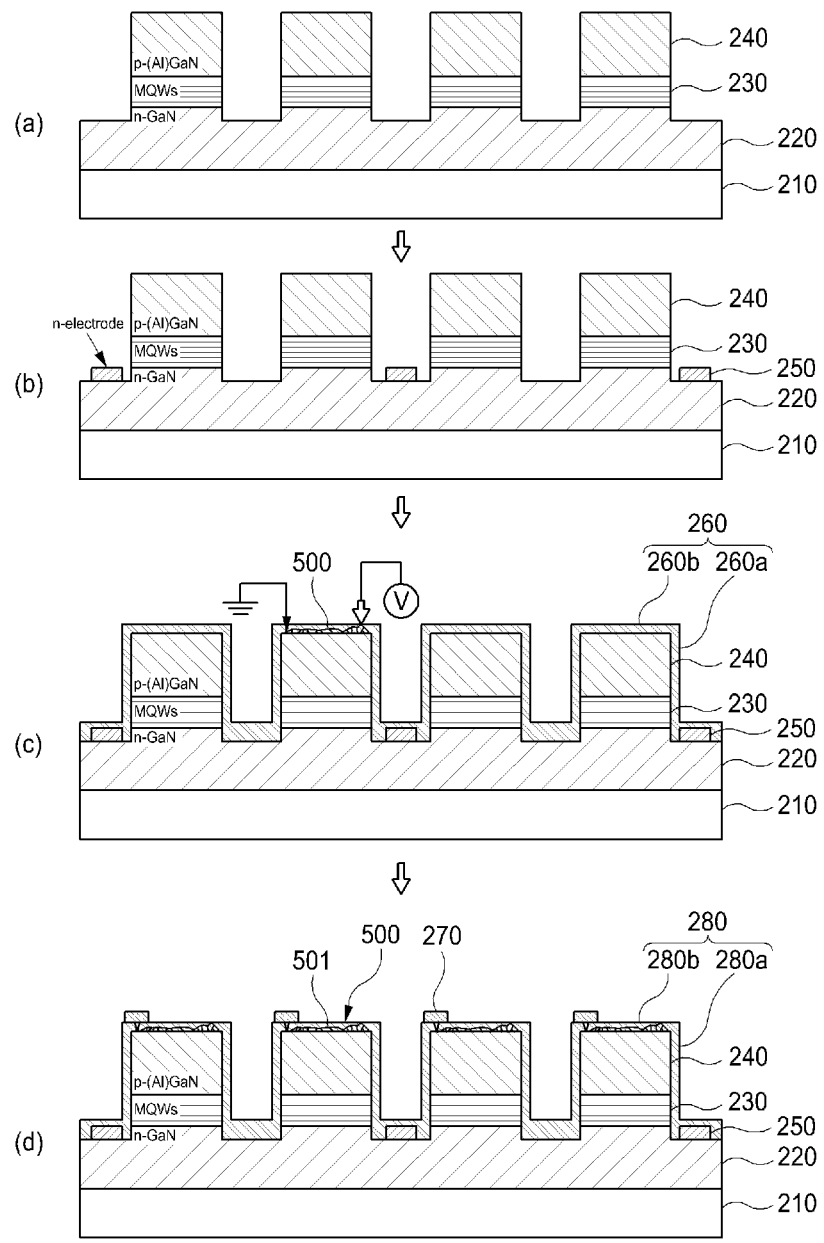
FIG. 3 is a view for explaining a process of manufacturing a micro LED and a structure of the micro LED manufactured through the manufacturing process according to a second preferred embodiment of the present invention.

FIG. 3 is a view for explaining a process of manufacturing a micro LED and a structure of the micro LED manufactured through the manufacturing process according to a second preferred embodiment of the present invention.

Referring to FIG. 3, in a second preferred embodiment of the present invention, one stage of the mask process may be additionally reduced when compared with the four stages of the mask process according to the first embodiment. Thus, when compared with the related art, two stages of the whole mask process may be further reduced.

A process of manufacturing a micro light emitting device (LED) according to the second embodiment of the present invention will be described with reference to FIG. 3. First, a first semiconductor layer 220, an active layer (MQW) 230, and a second semiconductor layer 240 are successively deposited on a substrate 210, and a MESA etching process is performed by using a first mask to separate a plurality of micro LED cells from each other on the substrate 210 in the same manner as the first embodiment (see FIG. 3(a)). In the second preferred embodiment of the present invention, the first semiconductor layer 220 may be an n-GaN layer, and the second semiconductor layer 240 may be a p-(Al)GaN layer. However, the first semiconductor layer 220 and the second semiconductor layer 240 may be made of materials different from each other according to specification of the LED.

Thereafter, a first electrode (an n-electrode) 250 corresponding to the first semiconductor layer 220 is formed on the first semiconductor layer 220, of which a surface is exposed to a space between the cells on a surface of the substrate 210, by using a second mask.

Then, a protective layer 280 is deposited on the entire area of the first semiconductor layer 220, the first electrode 250, and the second semiconductor layer 240 by using a variable resistance material that is a transparent material (see FIG. 3(c)). Here, in the case of the second embodiment, unlike the first embodiment, a separate hole 261 is not formed in an upper portion of the second semiconductor layer 240. Thus, in the case of the second embodiment, since it is unnecessary to provide the separate mask for forming the hole 261 illustrated in FIG. 2(c) according to the first embodiment, one mask process may be additionally omitted when compared with the first embodiment.

In the second embodiment, a voltage is applied to a region 280b of the protective layer made of a variable resistance material that is a transparent material on the second semiconductor layer 240 to form a conductive filament 501, thereby forming a transparent electrode 500. Here, to form the transparent electrode 500, in the second embodiment, a pair of probe electrodes may be spaced apart from each other to come into contact with the protective layer region 280b above the second semiconductor layer 240, and then, a voltage may be applied to locally form the conductive filament 501 within the protective layer region 280b.

In addition, in the second embodiment, to more smoothly form the conductive filament 501 in the protective layer region 280b above the second semiconductor layer 240, one of the pair of probe electrodes comes into strong contact with an upper portion of the protective layer region 280b to allow the probe electrode to pass through the protective layer region 280b and come into contact with the second semiconductor layer 240. As a result, substantially the same effect as the forming of the hole 261 in a portion of the protective layer region 260b according to the first embodiment may be realized.

When the transparent electrode 500 is formed on the second semiconductor layer 240, as illustrated in FIG. 3(d), a second electrode (a p-electrode) 270 is formed on the transparent electrode 500 by using a third mask in the same manner as that according to the first embodiment (FIG. 2(d)).

Here, the second electrode 270 may be formed at an any position on the transparent electrode 500, or at a position at which the second semiconductor 240 is exposed by the probe electrode's passing through the protective layer region 280b.

When the micro LED according to the present invention is manufactured, the n-electrode and the protective layer formed on the micro LED may be made of the variable resistance material that is the transparent material, and the voltage greater than the unique threshold voltage may be applied to the variable resistance material on the area of the protective layer formed on the upper portion of the p-type semiconductor layer to form the conductive filament in the variable resistance material, thereby forming the transparent electrode.

Thus, according to the present invention, the micro LED may be produced with the lower cost and higher productivity by omitting some of the mask process for forming the transparent electrode in the prior art.

Until now, preferred embodiments of the present invention have been described mainly. It will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method for manufacturing a micro light emitting device (LED), the method comprising:
   a step (a) of successively forming a first semiconductor layer, an active layer, and a second semiconductor layer on a substrate;
   a step (b) of successively etching the second semiconductor layer, the active layer, and the first semiconductor layer by using a first mask to expose the first semiconductor layer, thereby forming a plurality of micro LED cells on the substrate;
   a step (c) of forming first electrodes in parallel to each other in a plurality of rows between the micro LED cells by using a second mask;
   a step (d) of depositing a variable resistance material that is a transparent material on the whole area of the substrate to form a protective layer on the whole surface of the first electrodes and the second semiconductor layer of the plurality of micro LED cells and applying a voltage only to each of protective layer regions formed above the second semiconductor layer of the plurality of micro LED cells to form a conductive filament locally only in the protective layer regions formed above the second semiconductor layer, thereby changing the protective layer regions only on the second semiconductor layer of the plurality of micro LED cells into a transparent electrode; and
   a step (e) of forming a second electrode on the region which is changed into transparent electrode among the whole protective layer by using a third mask.

2. The method of claim 1, wherein, in the step (d), the protective layer is formed so that a hole for exposing a portion of the second semiconductor layer to the outside is formed by using a mask, and a voltage greater than a unique threshold voltage of the variable resistance material is applied to the portion of the second semiconductor layer exposed to the outside and a portion of the protective layer on the second semiconductor layer to form the conductive filament, thereby forming the transparent electrode.

3. The method of claim 1, wherein, in the step (e), the second electrode is deposited on the hole.

4. The method of claim 1, wherein, in the step (d), one of a pair of probe electrodes comes into strong contact with an upper portion of the protective layer to allow the probe electrode to pass through the protective layer formed on the second semiconductor layer, the other probe electrode comes into contact with the protective layer region formed above the second semiconductor layer, and a voltage greater than a unique threshold voltage of the variable resistance material is applied to form the conductive filament, thereby forming the transparent electrode.

5. The method of claim 1, wherein, in the step (e), the second electrode is formed at a position at which the probe electrode passes through the protective layer to expose the second semiconductor layer.

* * * * *